(12) United States Patent
Sekiya et al.

(10) Patent No.: US 6,498,356 B1
(45) Date of Patent: Dec. 24, 2002

(54) LED CHIP, LED ARRAY CHIP, LED ARRAY HEAD AND IMAGE-FORMING APPARATUS

(75) Inventors: Toshiyuki Sekiya, Mishima (JP); Mitsuo Shiraishi, Shizuoka-ken (JP); Ryuta Mine, Mishima (JP); Junji Ishikawa, Numazu (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/626,737

(22) Filed: Jul. 26, 2000

(30) Foreign Application Priority Data

Jul. 28, 1999 (JP) ............................................ 11-214166
Jul. 21, 2000 (JP) ....................................... 2000-221219

(51) Int. Cl.[7] .............................................. H01L 29/74
(52) U.S. Cl. ............................. 257/113; 257/88; 257/46
(58) Field of Search ................................... 313/500, 499; 357/17, 23, 16, 45, 68, 71, 30; 347/247; 257/113, 88, 146; 372/43; 359/298

(56) References Cited

U.S. PATENT DOCUMENTS

| | | | | |
|---|---|---|---|---|
| RE31,334 E | * | 8/1983 | Spaulding et al. | 346/1.1 |
| 4,933,601 A | * | 6/1990 | Sagawa et al. | 313/500 |
| 5,038,186 A | * | 8/1991 | Nishioka et al. | 357/17 |
| 5,045,895 A | * | 9/1991 | Yoshida et al. | 357/17 |
| 5,177,405 A | * | 1/1993 | Kusuda et al. | 257/136 |
| 5,451,977 A | * | 9/1995 | Kusuda et al. | 257/21 |
| 5,684,523 A | * | 11/1997 | Satoh et al. | 347/247 |
| 5,814,841 A | * | 9/1998 | Kusuda et al. | 224/238 |
| 5,866,439 A | * | 2/1999 | Nobori et al. | 438/22 |
| 5,952,680 A | * | 9/1999 | Strite | 257/103 |
| 6,297,842 B1 | * | 10/2001 | Koizumi et al. | 257/88 |

FOREIGN PATENT DOCUMENTS

| | | |
|---|---|---|
| JP | 1-238962 | 9/1989 |
| JP | 2-208067 | 8/1990 |
| JP | 2-212170 | 8/1990 |
| JP | 3-20457 | 1/1991 |
| JP | 3-194978 | 8/1991 |
| JP | 4-5872 | 1/1992 |
| JP | 4-23367 | 1/1992 |
| JP | 4-296579 | 10/1992 |
| JP | 5-84971 | 4/1993 |

OTHER PUBLICATIONS

"Proposal of Light Emitting Element Array for Optical Printer With Integrated Drive Circuit," *Japan Hard Copy*, 1991 (A–17).

"Self–scan Light Emitting Element (SLED) Using PNPN Thyristor Structure," Society of Electronic Information Communication ('90.3.5).

* cited by examiner

*Primary Examiner*—Olik Chaudhuri
*Assistant Examiner*—Laura M Schillinger
(74) *Attorney, Agent, or Firm*—Fitzpatrick, Cella, Harper & Scinto

(57) ABSTRACT

There is disclosed an LED array chip which can minimize LED optical property deterioration by addition of a surface protective film, and mainly side effects such as light quantity decrease and light quantity dispersion increase among light emitting bits. In the LED array chip comprising a plurality of LED light emitting elements arrayed in a row, a surface insulating film formed by the same material as a material of an inner-layer insulating film for forming a window to connect a wiring pattern in an internal electric circuit constitution and for establishing electric insulation between circuits and by the same thin film forming process as a process of the inner-layer insulating layer is formed in an thickness of 0.5 µm or less on the entire surface of a final surface layer excluding a wire bonding pad and including a light emitting portion surface.

10 Claims, 9 Drawing Sheets

LED CHIP, LED ARRAY CHIP, LED ARRAY HEAD AND IMAGE-FORMING APPARATUS

BACKGROUND OF THE INVENTION

1. Field of the Invention

The present invention relates to an LED chip and an LED array chip, and also relates to an LED array head for use as a recording light emitting element for forming a permanent visual image on a recording material by an electrophotographic recording system and an LED array chip disposed on the head. Moreover, the present invention relates to an image-forming apparatus provided with an LED array head.

2. Related Background Art

A conventional self-scan LED array (hereinafter referred to as "SLED") is disclosed in Japanese Patent Application Laid-open Nos. 1-238962, 2-208067, 2-212170, 3-20457, 3-194978, 4-5872, 4-23367, 4-296579, and 5-84971, Japan Hard Copy '91 (A-17) "Proposal of Light Emitting Element Array for Optical Printer with integrated Drive Circuit" and the Society of Electronic Information Communication ('91. 3.5) "Self-scan Light Emitting Element (SLED) using PNPN Thyristor Structure", and the like, and has been noted as a recording light emitting element. An LSI chipped self-scan LED array is hereinafter referred to simply as an LED array chip.

Here, an SLED array head constitution will be described. For the head, a schematic view is shown in FIG. 12. Numeral 211 denotes an SLED semiconductor chip (LED array chip), and 212 denotes a base substrate with the SLED semiconductor chip mounted thereon, in which a printed wiring board of a glass epoxy material, a ceramic material, or the like is used. Numeral 213 denotes a connector for receiving a control signal, and a power source from the outside. Numeral 214 denotes a lighting control circuit (driver IC) for generating a lighting control signal of the SLED semiconductor chip.

Numeral 215 denotes a bonding for connecting output signals φ1, φ2, φS, φI from the driver IC and a negative electrode side power source input (GND in the present example) to the respective SLED semiconductor chips, 216 denotes a positive electrode side power source pattern (+5 V in the present example) drawn to the base substrate 212, and 217 denotes a silver paste for establishing an electric conduction between the positive electrode side power source pattern 216 drawn to the base substrate 212 and a back surface electrode of the SLED semiconductor chip 211 and for bonding/fixing the chip.

Referring to FIG. 13, in order to radiate light 222 emitted from a light emitting portion 221 of the LED array chip 211 to a light-sensitive drum 224 without any loss, air and a condensing rod lens array 223 are usually present on a light path of the LED array chip 211 mounted on the substrate 212. The surface of the LED array chip 211 is usually provided with a pattern wiring 231 by aluminum. When the aluminum wiring 231 is exposed to the surface, however, aluminum is corroded by humidity, impurities, and the like in the air, and resistance value increase and wire breaking defect are sometimes caused in a short period. Therefore, in a conventional art, a polyimide or another resin film 232 functioning as a light transmission protective film is formed on the chip surface, so that the aluminum wiring 231 is prevented from being exposed.

However, since it is difficult to form the resin film 232 in a uniform and thin film thickness on the chip surface, a quantity of light emitted from the LED light emitting portion 221 and passed through the resin film 232, and light quantity unevenness among light emitting pixels are remarkably adversely affected. Moreover, for this purpose, particularly when a special semiconductor thin film forming process is added to form the resin film 232, considerable equipment investment is necessary, and manufacture cost of the LED array chip largely increases.

Moreover, as shown in FIG. 13, when the surface protective resin film 232 with a thickness longer than a light emitting wavelength is added, multi-reflection remarkably occurs in the surface protective film, and therefore flare light mixed from portions other than the light emitting portion deteriorates LED array optical properties.

SUMMARY OF THE INVENTION

An object of the present invention is to provide an LED array chip which can minimize LED optical property deterioration by addition of a surface protective film, and mainly side effects such as light quantity drop and light quantity dispersion increase among light emitting bits, an LED array head provided with the LED array chip, and an image-forming apparatus provided with the LED array chip.

According to the present invention, there is provided an LED array chip comprising a plurality of LED light emitting elements arrayed in a row, in which a surface insulating film formed by using the same material as a material of an inner-layer insulating film for forming a window to connect a wiring pattern in an internal electric circuit constitution and for establishing electric insulation between circuits and by using the same thin film forming process as a process of the inner-layer insulating film, and is formed on the entire surface of a final surface layer excluding a wire bonding pad and including a light emitting portion surface in a film thickness shorter than any light emitting wavelength of the plurality of LED light emitting elements.

Moreover, in the aforementioned LED array chip of the present invention, for the thickness of the surface insulating film, a center value is not more than 0.5 $\mu$m and not less than 0.1 $\mu$m.

Furthermore, in the aforementioned LED array chip of the present invention, the materials of the inner-layer insulating film and the surface insulating film are $SiO_2$.

Additionally, in the aforementioned LED array chip of the present invention, the thickness of the inner-layer insulating film is not less than once and not more than twice the thickness of the surface insulating film.

Moreover, in the aforementioned LED array chip of the present invention, a pattern wiring is disposed between the inner-layer insulating film and the surface insulating film.

According to the present invention, there is provided an LED array head comprising the aforementioned LED array chip.

According to the present invention, there is provided an image-forming apparatus comprising the aforementioned LED array head.

According to the present invention, there is further provided an LED chip comprising a substrate, a light emitting portion comprising an LED, and a driving portion for driving light emission of the light emitting portion, in which the light emitting portion and the driving portion are disposed on the same surface of the substrate, a surface protective layer for covering the light emitting portion also covers the driving portion, and a thickness of the surface protective layer is shorter than a wavelength of light emitted by the light emitting portion.

DETAILED DESCRIPTION OF THE PREFERRED EMBODIMENTS

First Embodiment

Figure 1:
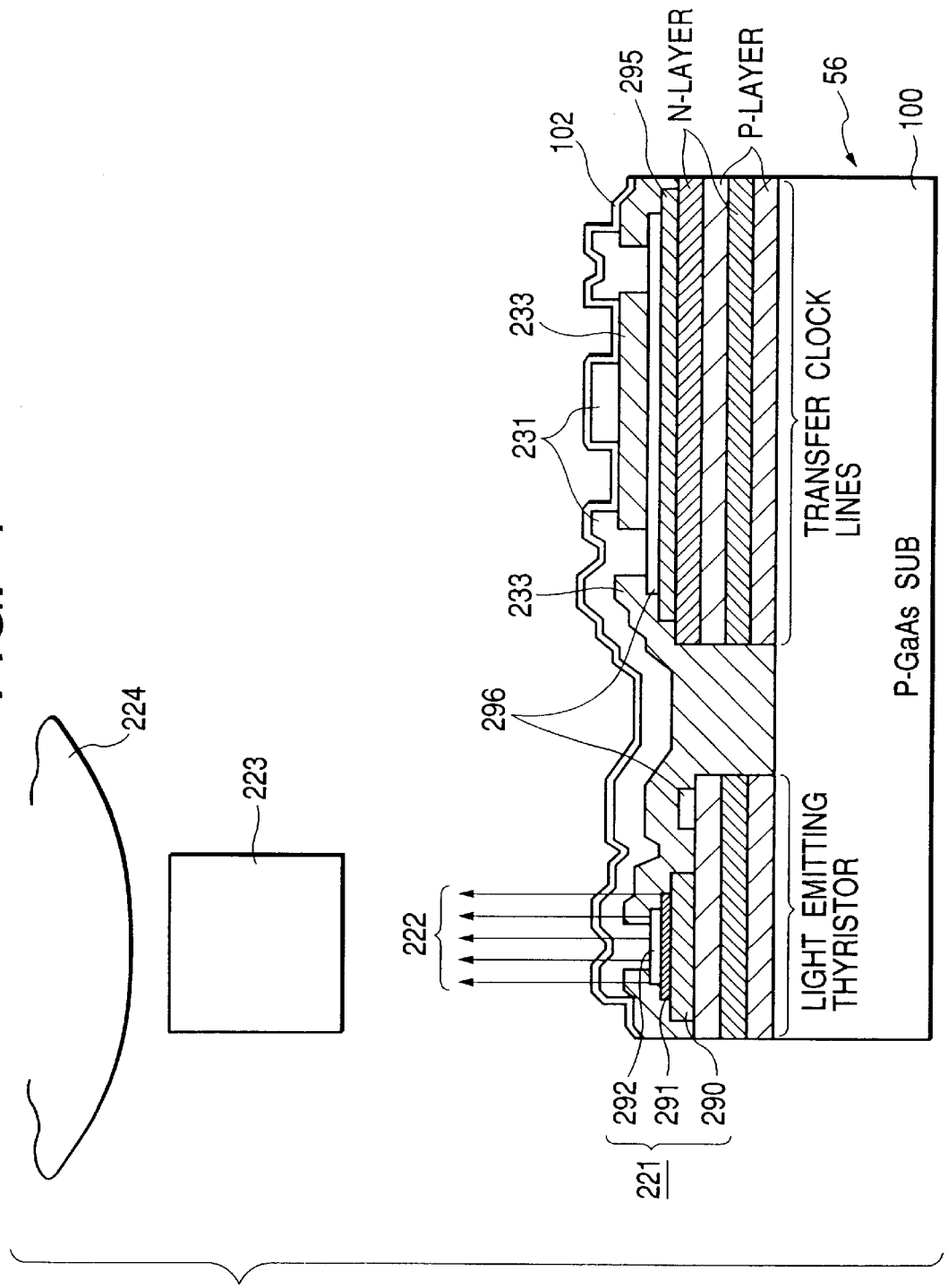
FIG. 1 is a sectional view of an LED array chip according to an embodiment of the present invention.

FIG. 1 is a schematic sectional view of an LED array chip 56 according to a first embodiment.

Figure 2:
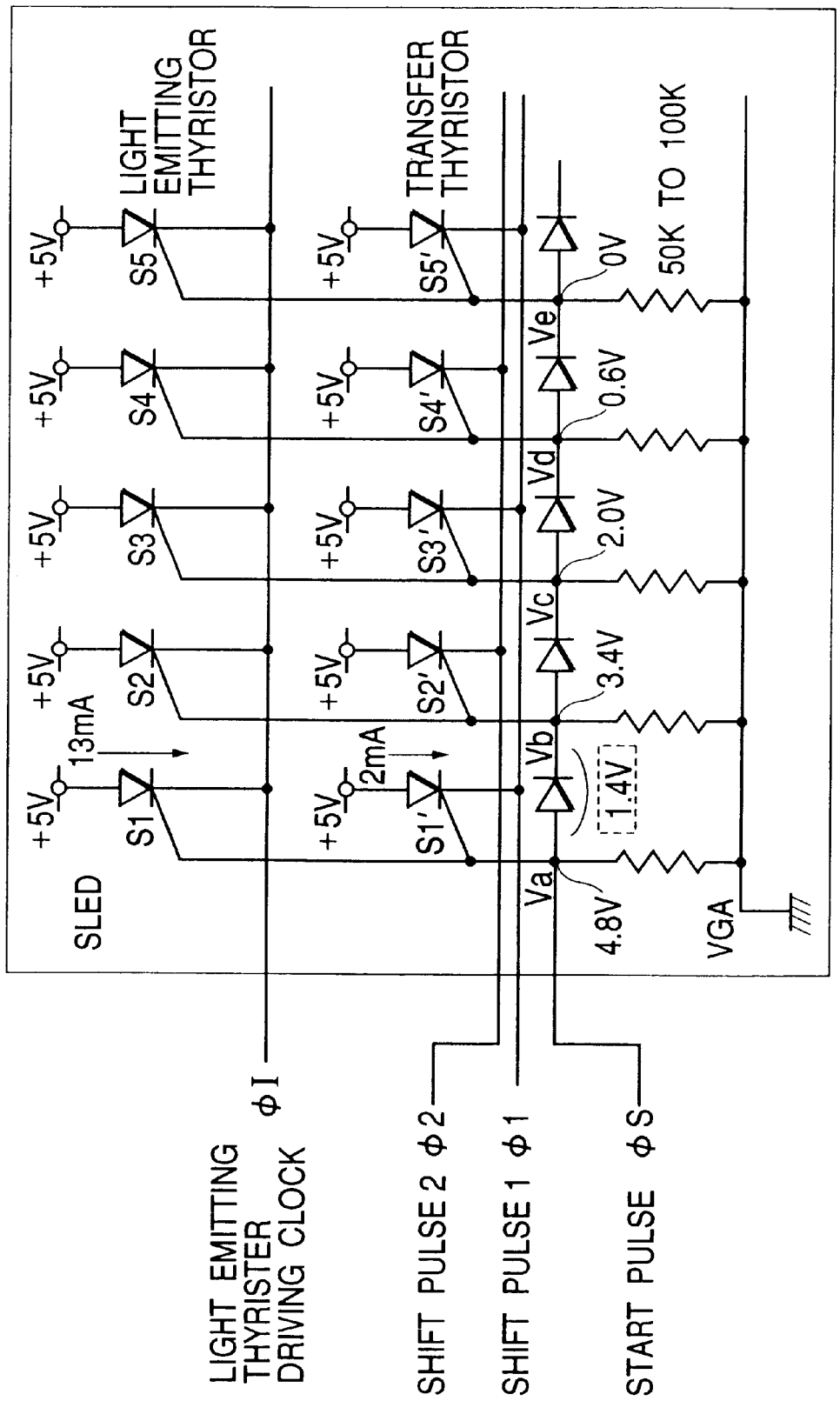
FIG. 2 is an SLED equivalent circuit diagram.

The LED array chip of the present embodiment is characterized in that thickness of a surface protective film 102 is shorter than a light emitting wavelength of an LED light emitting element. In the present embodiment, the wiring pattern means the electrically conductive pattern. The LED array chip shown in FIG. 1 comprises a light emitting thyristor and a transfer clock line, and these components are disposed apart from each other on one semiconductor substrate 100 of P-GaAs or the like. For the semiconductor substrate 100, a back surface is connected to a common electrode (not shown), and a constant voltage can be supplied to the light emitting thyristor and transfer clock line. A part of the light emitting thyristor or the transfer clock line comprises at least a p-type semiconductor layer or an n-type semiconductor layer, and either the p-type semiconductor layer or the n-type semiconductor layer is formed by vacuum treatment techniques such as a known CVD method and vacuum evaporation method. When the light emitting thyristor and transfer clock line are prepared by the vacuum treatment technique, they are disposed apart from each other by etching or the like. The p-type semiconductor layer or n-type semiconductor layer constituting the light emitting thyristor or transfer clock line is prepared once by the aforementioned vacuum treatment technique as occasion demands. Specifically, as shown in FIG. 2, when the p-type semiconductor layer disposed to abut on the semiconductor substrate 100 is formed on both the light emitting thyristor and the transfer clock line, the layer can be prepared once by the aforementioned vacuum treatment technique.

For the light emitting thyristor, the light emitting portion 221 is disposed on the semiconductor layer formed of the n-type and p-type semiconductor layers. The light emitting portion 221 is constituted of an n-type semiconductor layer 290, an AuGeNi film 291 on the semiconductor layer, and an Au film 292 on the AuGeNi film. Light is generated between the n-type semiconductor layer and the underlying p-type semiconductor layer. Moreover, an AuZu film 296 is disposed on the aforementioned semiconductor layer of the n-type and p-type semiconductor layers of the light emitting thyristor.

On the other hand, for the transfer clock line the AuZu film 296 is disposed on the semiconductor layer formed of the n-type and p-type semiconductor layers. Additionally, numeral 295 denotes an insulating layer formed on a cathode line (uppermost n-type layer) of each transfer thyristor constituting the transfer clock line, and is formed of silicon oxide ($SiO_2$). Since every other cathode lines of the transfer thyristor are connected to φ1 and φ2, respectively, a cross section on a side insulated by the insulating layer is shown.

An insulating film 233 is disposed between the light emitting thyristor and the transfer clock line. The insulating film 233 is of silicon oxide ($SiO_2$). The insulating film 233 is disposed to substantially cover the inner-layer surfaces of both the light emitting portion 221 of the light emitting thyristor and the transfer clock line in order to realize electric insulation in subsequently treating the aluminum wiring 231. The insulating film 233 in the light emitting thyristor is opened in a part of the light emitting portion 221 so that electric connection by the aluminum wiring is performed to the surface of the n-type semiconductor layer as the uppermost layer of the thyristor structure, the opening simultaneously serves as a light emitting portion window, and light goes to the outside of the LED array chip 56 in the vicinity of the aluminum wiring.

Moreover, the insulating film 233 in the transfer clock line has some openings in the AuZu film, but the metal wiring 231 is embedded in the openings. The metal wiring 231 is of copper, aluminum, or the like. Above all, aluminum is used in the present embodiment.

The metal wiring 231 is extended also to the light emitting thyristor from the transfer clock line. The transfer clock line is satisfactorily electrically connected to the light emitting thyristor by this metal wiring. Additionally, in FIG. 1, the metal wiring 231 is disposed on the inner side from the window of the light emitting portion 221. Specifically, the metal wiring 231 does not fill in the window.

In the present embodiment the LED array chip is constituted by arranging an array of LED light emitting portions in one direction, and a plurality of light emitting windows are disposed opposite to and apart from the respective light emitting portions in drawing front and back surface directions. However, with respect to one window among these, FIG. 1 is a schematic sectional view clearly showing the constitution in a direction to the transfer clock line from the light emitting thyristor.

In the present embodiment, each LED light emitting wavelength of the LED array chip 56 is 780 nm. Moreover, for example, a 0.26 μm $SiO_2$ film functioning as the surface protective film 102 is disposed on the entire chip surface excluding a wire bonding pad portion (not shown) on the chip surface. The surface protective film 102 uses the same material as that of the inner-layer interlayer $SiO_2$ insulating film 233. Additionally, both the surface protective film and inner-layer insulating film 233 are formed using plasma CVD. The thickness of the surface protective film 102 is shorter than the light emitting wavelength, the film is remarkably thin, and such a thin film can be formed on the entire chip surface. The thickness of the inner-layer interlayer $SiO_2$ insulating film 233 is set to 0.4 μm in the present embodiment. The inner-layer interlayer $SiO_2$ insulating film 233 is disposed to form the wiring pattern connecting window in the internal electric circuit constitution and to establish the electric insulation between the circuits.

In the present embodiment, a remarkably thin surface insulating film can be obtained. As a result, optical property inhibiting factors such as flare can be prevented. Additionally, in the present embodiment $SiO_2$ is used in the surface protective film 102 and the insulating layer 233, that is, the inner-layer interlayer insulating film 233, but it is preferable in the present invention to use the same material in the surface protective film and the insulating film 233. When the same material is used, a thermal expansion coefficient is equal, and even during expansion or contraction, both films can be prevented from deviating or detaching from each other. Alternatively, for example, one of both films is formed of $SiO_2$ and the other is formed of SiN, and materials approximate to each other in thermal expansion coefficient may be used. Additionally, the present invention can be applied to the LED array chip in which one or more LED light emitting portions are disposed and one or more transfer clock lines (driving portions) are disposed.

Moreover, in the present embodiment, by setting the thickness of the surface protective film 102 added to the chip surface to be equal to or less than each LED light emitting wavelength of the LED array chip 56, an LED emitted light transmission amount decrease can be controlled to provide 10% or less. Furthermore, since the thick light transmission protective film 232 of epoxy or the like described in the conventional art is not used, influence of flare light by multiple reflection can be minimized. Moreover, when a general red color, almost red color LED with a wavelength of about 680 to 780 nm is used, by setting the center value of the thickness of the surface protective film to 0.5 μm or less in the present embodiment, and even by including an actually generated film thickness dispersion, the effect can be stabilized and clarified.

On the other hand, with too thin surface protective film 102, protecting ability itself as the protective film is deteriorated, and the film thickness of 0.1 μm or more is therefore necessary in order to sufficiently maintain the function of the protective film. In the present embodiment, in consideration of the aforementioned condition, the 0.26 μm thick surface protective film 102 within the range is formed.

Moreover, by using the same manufacture process and material in the inner-layer interlayer insulating film 233 and the surface protective film 102, stable optimum control of a film stress relation and chip film formation are facilitated. Specifically, when the inner-layer insulating film 233 and surface protective film are prepared using different materials and semiconductor processes, in order to maintain an adequate film stress relation between both films, respective various process parameters have to be controlled with a high precision. On the other hand, when the same manufacture process and material are used in the inner-layer interlayer insulating film 233 and the surface protective film, only each film thickness may be managed to provide an adequate value.

Furthermore, by using the same manufacture process and material as those of the inner-layer interlayer insulating film 233 for the surface protective film 102, and by setting a film thickness relation between the inner-layer insulating film 233 and the surface protective film 102 in a range of 2:1 to 1:1, a balance of film stress between the films is optimized, and stripping and rising of inner-layer insulating film 233, and cracking or the like of the surface protective film 102 in a contact portion of the aluminum wiring 231 with the LED element can be inhibited. In the present embodiment, the relation is set to 0.4:0.26 close to the center value in the film thickness ratio range of 2:1 to 1:1 in which the aforementioned balance can be maintained.

Second Embodiment

In a second embodiment, the LED array chip of the first embodiment is applied to a self-scan LED array (SLED).

Figure 3:
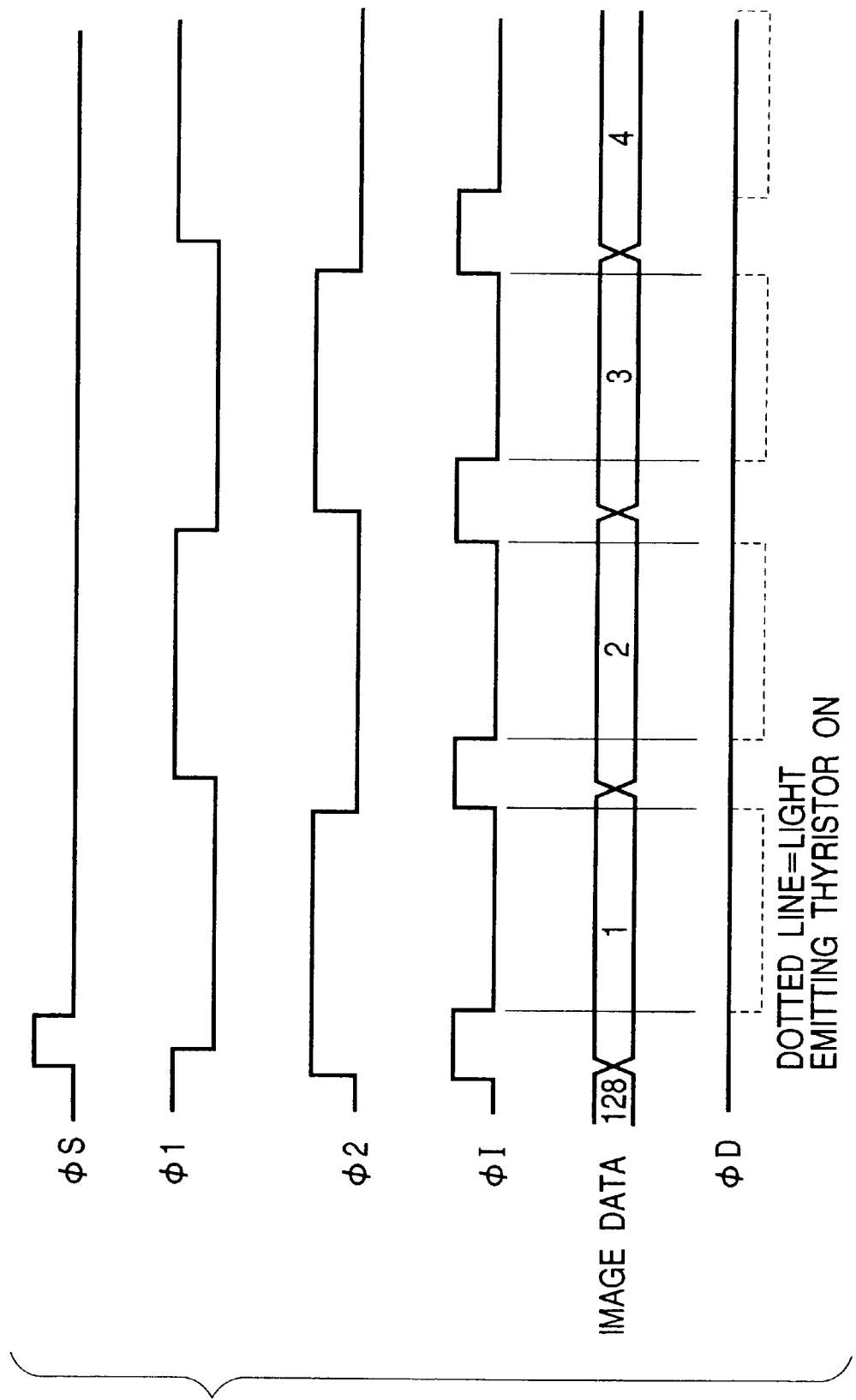
FIG. 3 is a timing chart of a control signal for controlling an SLED.

FIG. 2 is a diagram showing one structural example of the SLED. FIG. 3 shows a conventional control signal and timing for controlling the SLED, and shows an example in which all elements are lit. The constitution and driving method of the SLED will be described with reference to FIGS. 2, 3.

Referring to FIG. 2, a ground voltage VGA of SLED is connected via a resistance to a plurality of diodes cascade-connected to a start pulse φS. The SLED comprises transfer thyristors arranged in an array, and light emitting thyristors arranged in an array, gate signals of respective rows and types of thyristors are connected to one another, and two thyristor gates in a first row are connected to a signal input portion of start pulse φS. Two thyristor gates in a second row are connected to a cathode of a diode whose anode is connected to a terminal for inputting the start pulse φS. This also applies to third and subsequent rows.

Transfer and light emitting will be described with reference to a timing chart of FIG. 3. First, the transfer starts by changing the start pulse φS to 5 V from 0 V. Additionally, since φS is driven with a finite output impedance by an external driving circuit (not shown), a voltage slightly lower than 5 V is actually applied to φS. When the start pulse φS is 4.8 V, by setting a diode forward direction voltage fall to 1.4 V, Va=4.8 V, Vb=3.4 V, Vc=2.0 V, 0 V on and after Vd, and gate signals of transfer thyristors S1' and S2' are 4.8 V, 3.4 V, respectively. By changing a shift pulse φ1 to 0 V from 4.8 V in this state, respective portion potentials of the transfer thyristor S1' are obtained as anode: 5 V, cathode: 0 V, gate: 3.4 V, ON conditions are satisfied with respect to the transfer thyristor S1', and the transfer thyristor S1' turns on. However, even when the external driving circuit for the shift pulse φS is changed to 0 V in this state, the transfer thyristor S1' is on and nearly Va=4.8 V is held. This is because the pulse is applied to φS via the resistance, and upon turning on the thyristor, the potential between the anode and the gate substantially becomes equal. Therefore, even when the start pulse φS is set to 0 V, the ON conditions of the first transfer thyristor S1' are held, and a first shift operation ends. When a light emitting thyristor driving clock φI signal is changed to 0 V from 5 V in this state, the same conditions as those for turning on the transfer thyristor are obtained, the light emitting thyristor S1 turns on, and a first LED is lit. For the first LED, when the light emitting thyristor driving clock φI is reset to 5 V, no potential difference between the anode and the cathode of the light emitting thyristor S1 is made, a thyristor minimum holding current fails to flow, and the light emitting thyristor S1 therefore turns off. Transferring of the thyristor ON conditions to a transfer thyristor S2' from the transfer thyristor S1' will next be described. Even when the light emitting thyristor S1 turns off, the shift pulse φ1 stays at 0 V, the transfer thyristor S1' therefore remains to be on, the gate voltage of the transfer thyristor S1' is nearly Va=4.8 V, and the gate voltage of the transfer thyristor S2' is Vb=3.4 V. By changing a shift pulse φ2 to 0 V from 5 V, the respective portion potentials of the transfer thyristor S2' are obtained as anode: 5 V, cathode: 0 V, gate: 3.4 V, and the transfer thyristor S2' therefore turns on. After the transfer thyristor S2' turns on, by changing the shift pulse φ1 to 5 V from 0 V, the transfer thyristor S1' turns off in a similar manner as when the light emitting thyristor S1 turns off. In this manner, the transfer thyristor to turn on shifts to the transfer thyristor S2' from the transfer thyristor S1'. Subsequently, when the light emitting thyristor driving clock φI is changed to 0 V from 5 V, the light emitting thyristor S2 turns on to emit light. Additionally, a reason why only the light emitting thyristor for the transfer thyristor having turned on can emit light lies in that when the transfer thyristor is not on, the gate voltages of the thyristors except the thyristor adjacent to the thyristor having turned on are 0 V, and therefore the thyristor ON conditions are not obtained. Also for the adjacent thyristor, when the light emitting thyristor turns on, the potential of the light emitting thyristor driving clock φI turns to 3.4 V (for the light emitting thyristor forward direction voltage fall amount of 1.6 V), no potential difference is made between the gate and the cathode, and the adjacent thyristor cannot be turned on.

Additionally, it has been described above that by setting the light emitting thyristor driving clock φI to 0 V, the light emitting thyristor turns on to emit light, but in an actual print operation, it is naturally necessary to control whether or not to actually emit light at the timing in accordance with image data. In FIG. 3, a signal φD indicates the image data, for φI terminal of SLED a logical sum of φI and image signal is obtained outside, only with the image data of 0 V, the SLED φI terminal actually turns to 0 V to emit light, and with the image data of 5 V, the SLED φI terminal stays at 5 V to emit no light.

Figure 4:
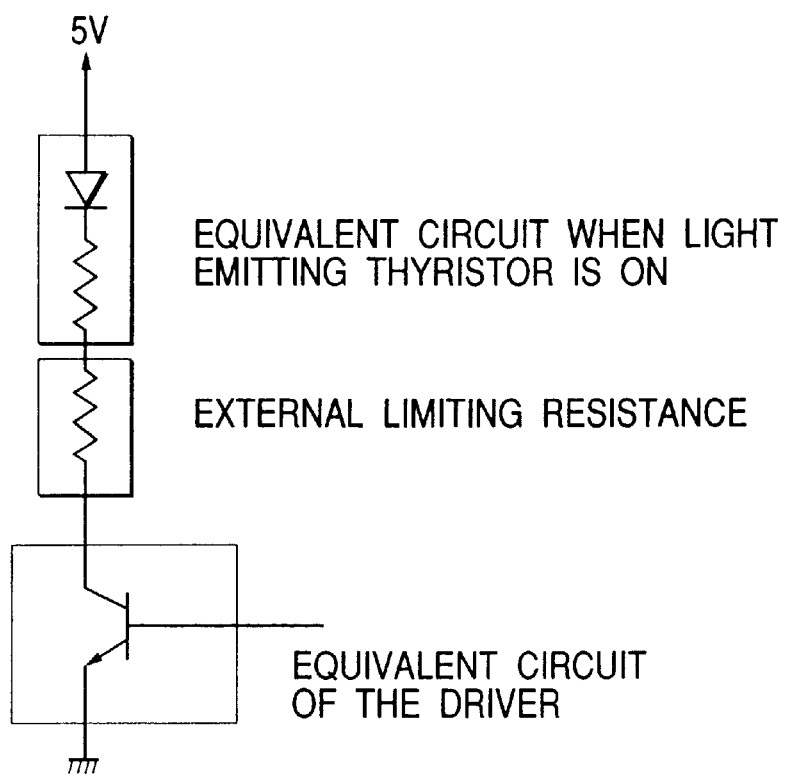
FIG. 4 is an equivalent circuit diagram during driving of respective SLED light emitting pixels.
Figure 5:
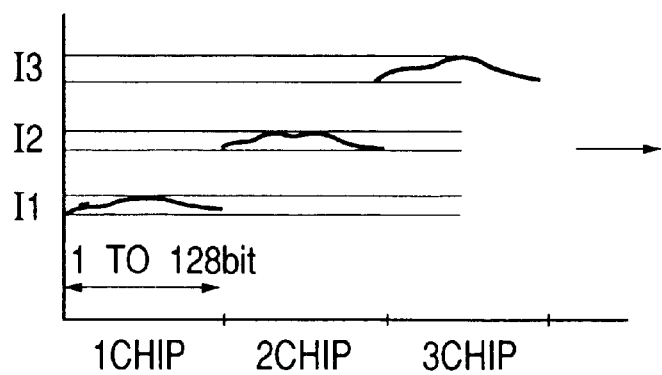
FIG. 5 is a chart showing differences in driving current between chips and between light emitting pixels in the chip by dispersions of SLED forward direction voltage fall amount and internal resistance, and shows respective pixel driving currents when outputs of drivers for driving φI of a plurality of LED array chips are all provided with the same current limiting resistance RaΩ.
Figure 6:
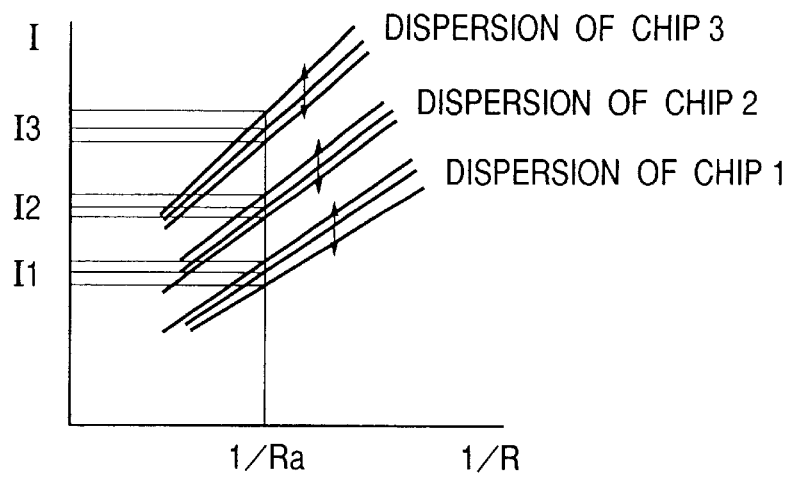
FIG. 6 is a graph showing a relation between an inverse number of the current limiting resistance and the driving current of the respective light emitting pixels of the respective LED array chips.

One LED array chip is constituted as described above, provided with 128 light emitting thyristors, and selectively successively lit/controlled by the transfer thyristor. An equivalent circuit during driving of each light emitting pixel is shown in FIG. 4. A driving current is obtained by dividing a voltage obtained by subtracting the forward direction voltage fall amount of the light emitting diode portion of the light emitting thyristor from a power source voltage by a sum of an external current limiting resistance value and thyristor internal resistance value. Therefore, even in one LED array chip, when the forward direction voltage fall amount and internal resistance value of each light emitting pixel are dispersed, the driving current also fluctuates by the amount. However, the dispersions of the forward direction voltage fall amount and internal resistance value among the light emitting pixels in one LED array chip are generally low as compared with the dispersions of average values of the forward direction voltage fall amounts and internal resistance values among the LED array chips. This state is shown in FIGS. 5 and 6. FIG. 5 shows respective pixel driving currents when outputs of drivers for driving φI of a plurality of LED array chips are all provided with the same current limiting resistance RaΩ. The abscissa indicates an array of the respective light emitting pixels of each chip, and the ordinate indicates the corresponding driving currents. FIG. 6 shows a relation between an inverse number of the current limiting resistance and the driving current of the respective light emitting pixels of the respective LED array chips.

Figure 7:
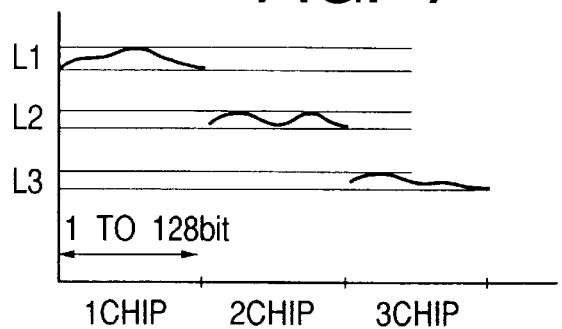
FIG. 7 is a chart showing respective pixel light emitting amounts during driving of φI of a plurality of LED array chips by an ideal constant-current circuit (current value Ia).
Figure 8:
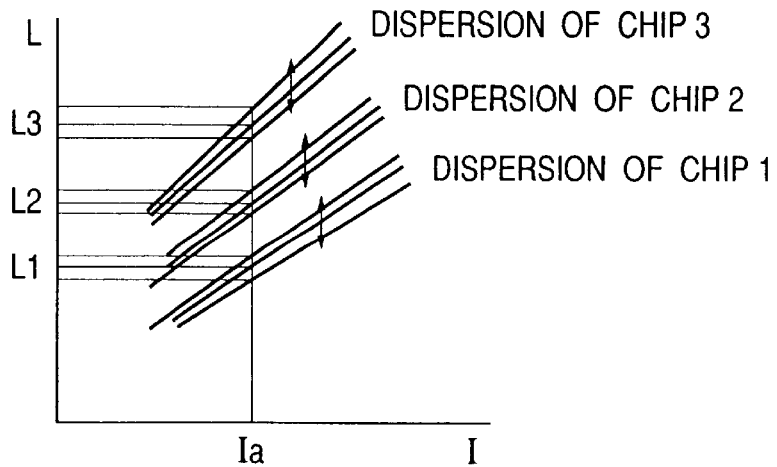
FIG. 8 is a graph showing a relation between the driving current and the light emitting amount for the respective light emitting pixels of the respective LED array chips.
Figure 9:
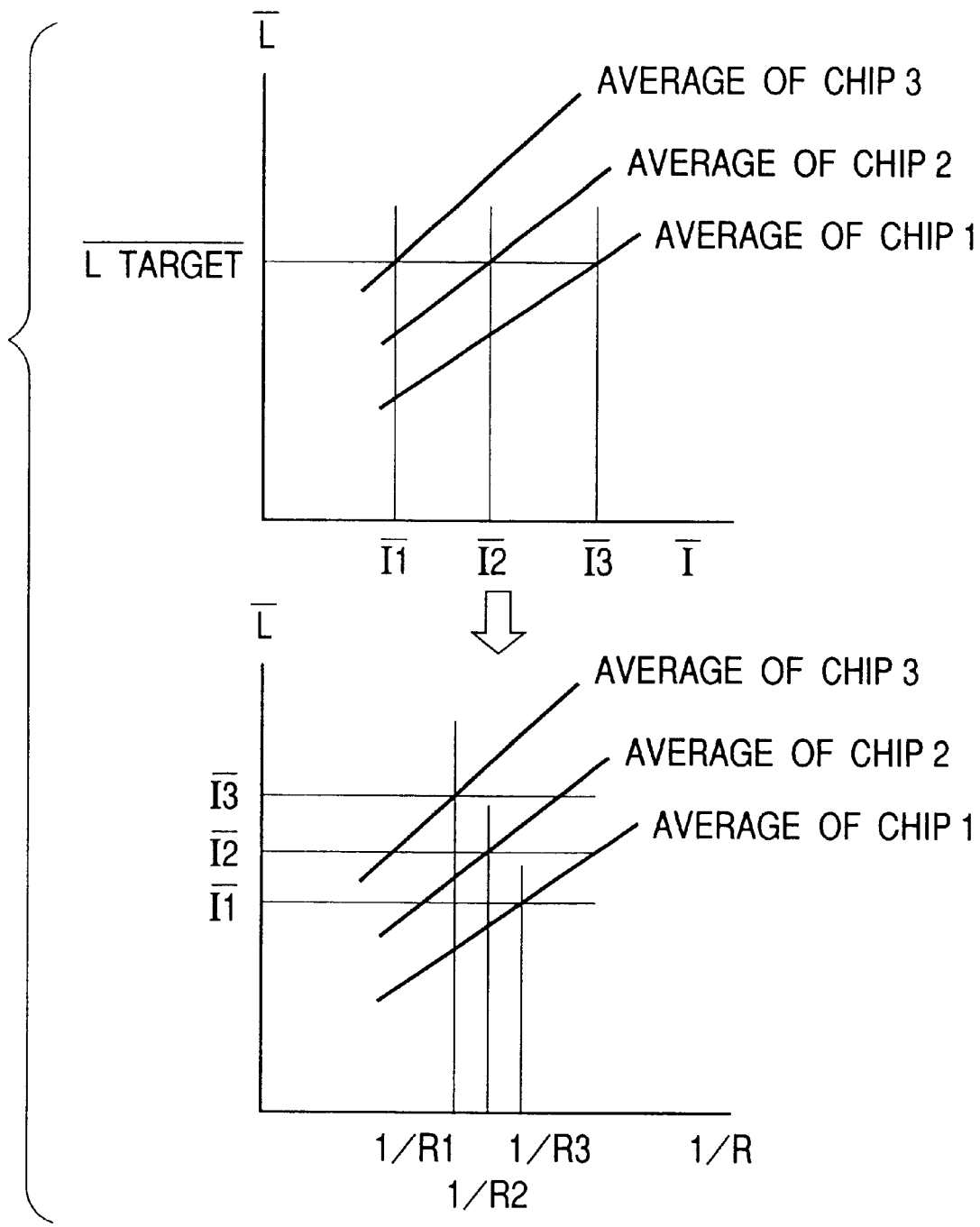
FIG. 9 is an explanatory view showing a method of determining external resistance values of the respective LED array chips.

On the other hand, similarly for the relation between the driving current and light emitting amount of the LED array chip, the dispersion among the respective pixels in one LED array chip is generally lower than the dispersion of the average value among the LED array chips. This state is shown in FIGS. 7 and 8. FIG. 7 shows the light emitting amounts of the respective pixels during driving of φI of a plurality of LED array chips by an ideal constant-current circuit (current value Ia). The abscissa indicates an array of the respective light emitting pixels of each chip, and the ordinate indicates the corresponding light emitting amounts. FIG. 8 shows a relation between the driving current and the light emitting amount for the respective light emitting pixels of the respective LED array chips.

Therefore, for the respective LED array chips mounted on one LED light emitting apparatus, an average driving current by which a predetermined target average light quantity L can be obtained is first calculated in accordance with relations between the average driving current and the average light quantity and between the average driving current and the external resistance value, an external resistance value is next calculated so that the average driving current is obtained, and a closest value is selected and mounted from commercial nominal resistance values such as 24 series and 96 series. Thereby, prepared is an LED array apparatus in which an average light quantity difference among the respective LED array chips is controlled within a predetermined range.

Third Embodiment

A third embodiment relates to an image-forming apparatus of an electrophotographic system provided with the array chip of the first embodiment.

Figure 10:
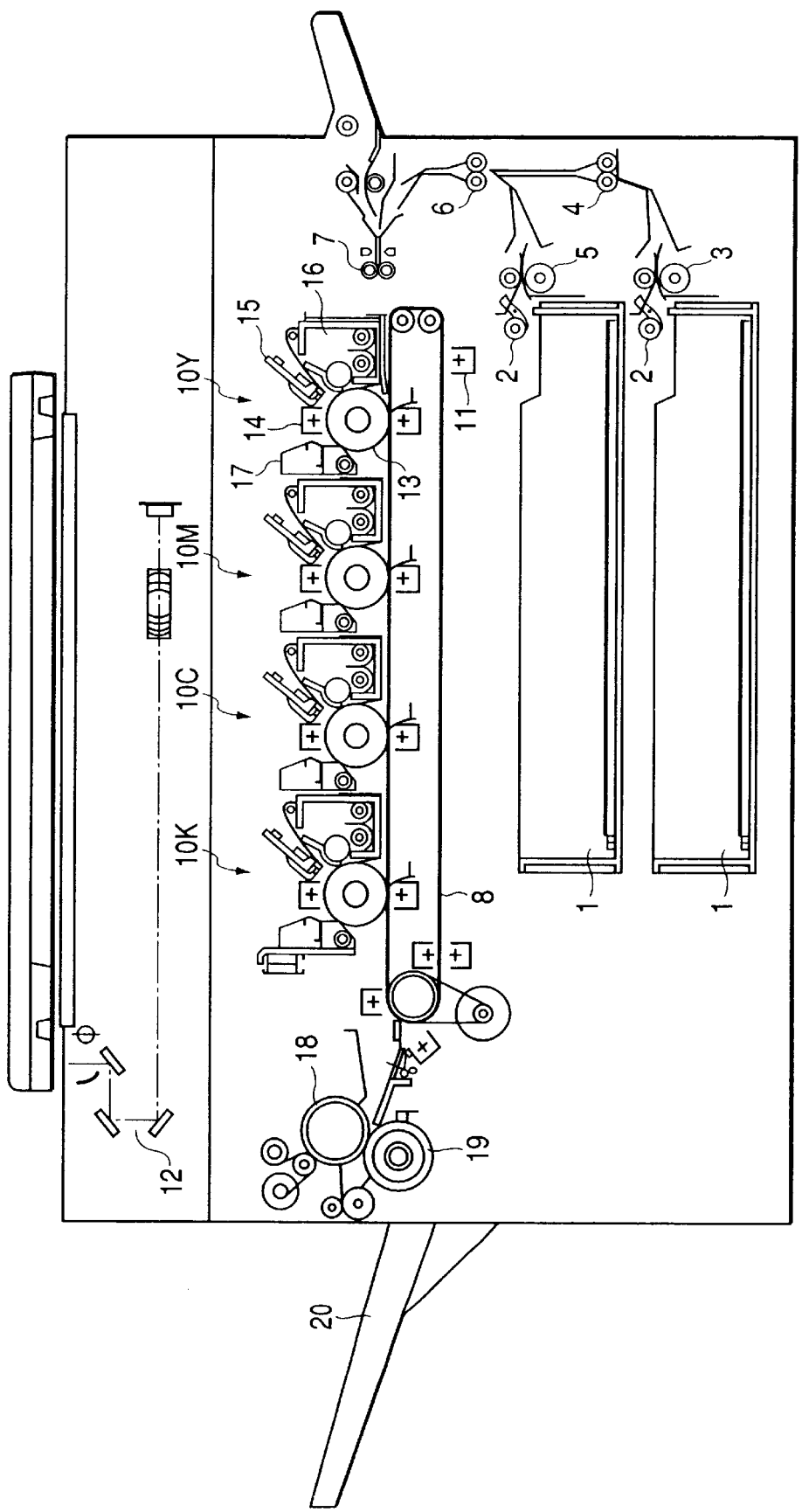
FIG. 10 is a schematic sectional view of an image-forming apparatus using the LED array head according to the embodiment of the present invention.

FIG. 10 shows one example of the embodiment of the present invention. This apparatus is a color electrophotographic copying machine for superposing four-color toners of magenta, cyan, yellow, and black to form an image.

Characters 10Y, 10M, 10C, 10K denote yellow, magenta, cyan, and black image-forming portions, and 8 denotes a transferring belt.

A recording sheet contained in a cassette 1 is fed by a sheet feeding roller 2, and subsequently conveyed by conveying rollers 3 to 6 to reach a registration roller 7. For the recording sheet, skew feeding or the like is corrected by the registration roller 7, and timing is adjusted so that the recording sheet is conveyed toward the transferring belt 8. The transferring belt 8 is formed of an insulating resin sheet material, and a sheet surface is charged by a charging device 11 disposed under the transferring belt 8. In this case, in accordance with image information signals transmitted from an original reading apparatus 12, or a computer or another output apparatus (not shown), latent images for respective colors are formed on photosensitive drums 13C, 13M, 13Y, 13K. The recording sheet conveyed from the registration roller 7 is electrostatically attached to the charged transferring belt, and passed and conveyed under the respective color image-forming portions 10Y, 10M, 10C, 10K by the transferring belt 8.

In the respective image-forming portions, a charging device 14, exposing LED array head 15, developing device 16, and cleaner 17 are arranged around the photosensitive drum 13, and respective color toner images are formed on the surface of the photosensitive drum 13 by an electrophotographic process.

For the recording sheet electrostatically attached to and conveyed by the transferring belt 8, when the transferring belt 8 approaches the photosensitive drum 13, the respective color images are successively transferred onto the recording sheet. The recording sheet with the four color images transferred thereto is stripped from the transferring belt 8 by curvature separation, and reaches a pair of fixing rollers 18, 19. The fixing roller 18 is heated by a heater (not shown), the respective color toners are thermally molten and fixed onto the recording sheet and the color image is completed.

The recording sheet with the toner image fixed on the surface thereof by the fixing roller pair 18, 19 is discharged onto a sheet discharge tray 20 protruded out of the apparatus.

Figure 11:
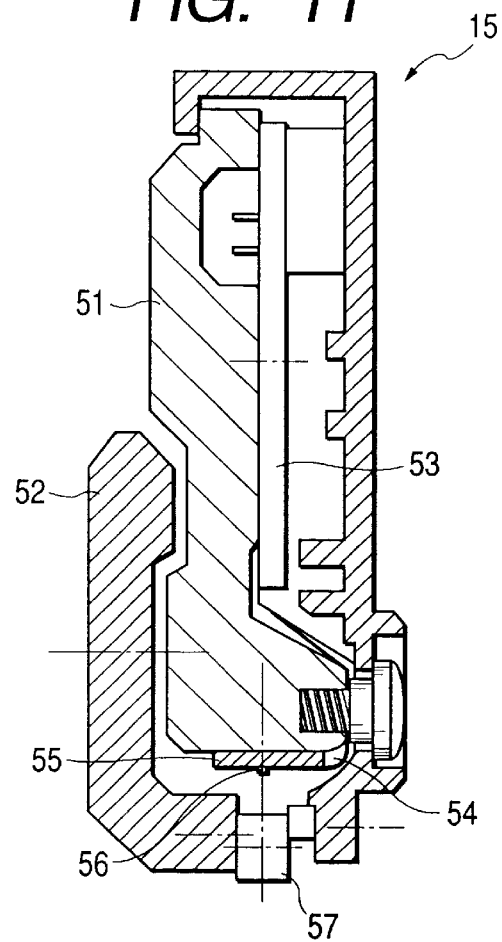
FIG. 11 is a sectional view of the LED array head according to the embodiment of the present invention.
Figure 12:
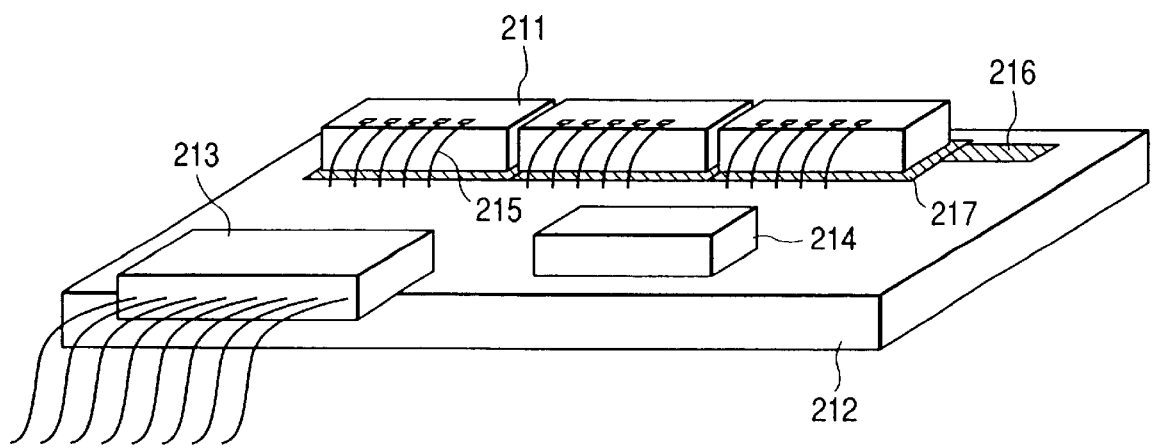
FIG. 12 is a perspective view showing SLED mounting appearance.
Figure 13:
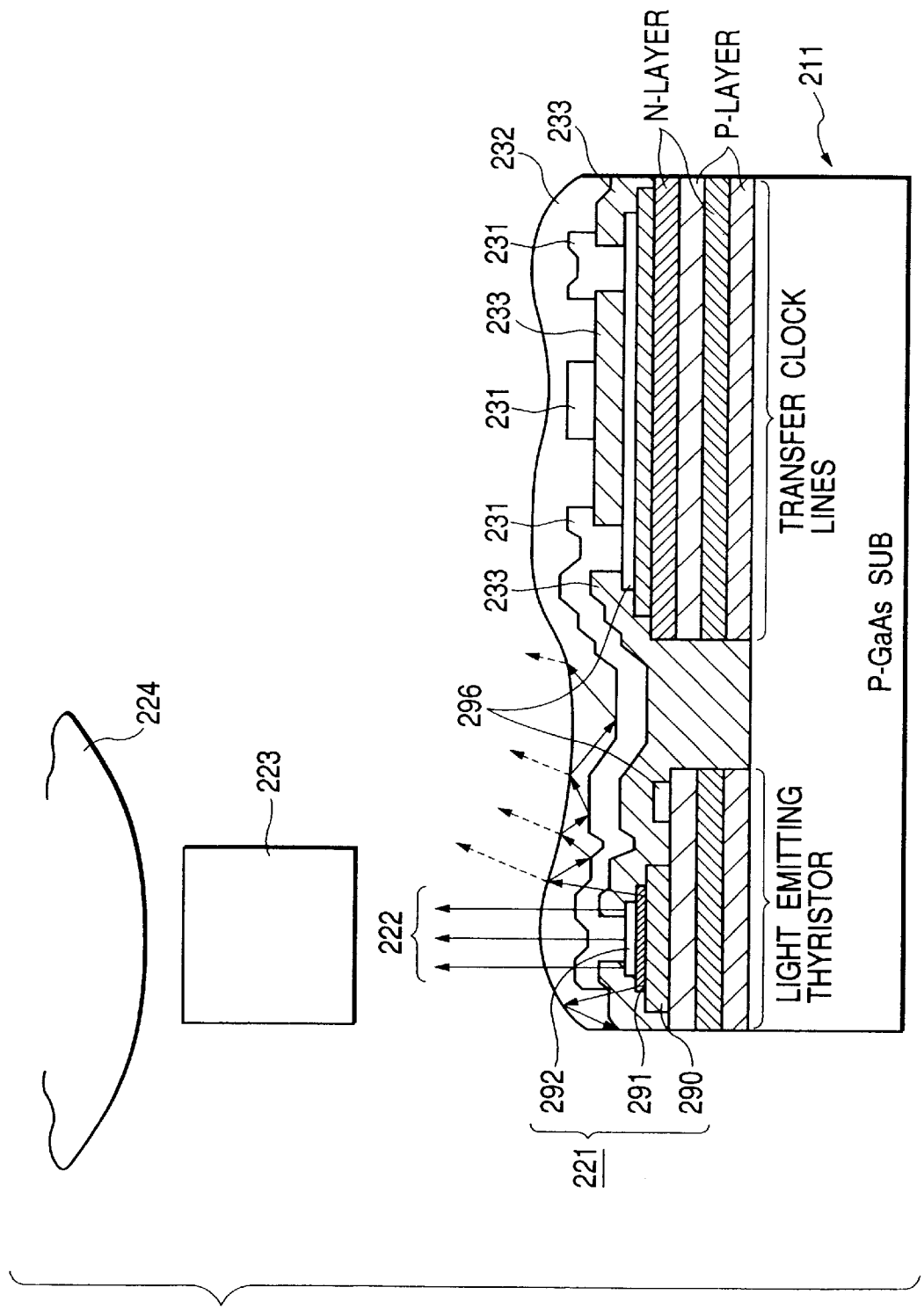
FIG. 13 is a sectional view showing a conventional LED array chip.

Here, the exposing LED array head 15 will be described in detail with reference to FIG. 11. FIG. 11 is a sectional view of the exposing LED array head 15.

A plurality of light emitting chips 56 each provided with an LED array in which a plurality of light emitting elements are formed on the surface in an array in a depth direction of the drawing by a semiconductor manufacture process are arranged on a light emitting chip mounting substrate 55, and form a row of light sources. The light emitting chip mounting substrate 55 is formed of ceramic so that heat emitted by the light emitting chip 56 is satisfactorily discharged, and is fixed to a substrate base 51 provided with a heat discharging function by measures such as an adhesive, vis screw, and double-coated tape.

A driver chip (not shown) and resistance (not shown) for driving the respective light emitting elements are mounted on a driver substrate 53. A signal for controlling a light emitting pattern is also inputted to the driver substrate 53. The drive substrate 53 is fixed via the vis screw to the substrate base 51 to which the light emitting chip mounting substrate 55 is fixed. The light emitting chip mounting substrate 55 is electrically connected to the driver substrate 53 via a flexible cable 54. By separating the light emitting chip mounting substrate 55 with the light emitting chip 56 mounted thereon from the driver substrate 53 in this manner, the heat generated from the driver and resistance mounted on the driver substrate 53 is not easily conducted to the light emitting chip, and the exposing LED array head 15 can be miniaturized. The substrate base 51 is formed of aluminum which easily conducts heat from the light emitting chip mounting substrate 55 and driver substrate 53 and which has a good processability.

On the other hand, the light emitted from the light emitting chip 56 is converged as a micro spot by a converging optical fiber lens array 57 and formed into a latent image on the surface of the photosensitive drum 13 in the color image-forming apparatus. The converging optical fiber lens array 57 is bonded to a lens support member 52.

As described above, according to the present invention, since the LED chip is provided with the surface protective film with a thickness shorter than the light emitting wavelength, high optical property can be realized. Moreover, according to the present invention, in each LED semiconductor chip, the surface insulating film formed by using the same material as the material of the inner-layer insulating film for forming the wiring pattern connecting window in the internal electric circuit constitution and for establishing the electric insulation between the circuits and by the same thin film forming process as that of the inner-layer insulating film is formed in the thickness of 0.5 $\mu$m or less on the entire surface of the final surface layer, excluding the wire bonding portion pad and including the light emitting portion surface. Moreover, the $SiO_2$ film is formed as the surface insulating film. Furthermore, by forming the inner-layer insulating film in the thickness not less than once and not more than twice the thickness of the surface film, the LED optical property deterioration by the addition of the surface protective film, and mainly the side effects such as the light quantity decrease and the light quantity dispersion increase among the light emitting bits can be minimized, the relation of mutual film stress between the inner-layer insulating film and the surface protective film can easily be optimized, the occurrence of the inner-layer insulating film stripping, film rising, and surface protective film cracking in the contact portion of the aluminum wiring and LED element in the contact portion of the aluminum wiring and LED element can be inhibited, and the manufacture of the high-quality, high-reliability LED array chip can be realized.

What is claimed is:

1. A light-emitting element array chip comprising:
   a plurality of LED light-emitting elements with a light-emitting region on a surface side of the chip;
   an internal electric circuit to control said light-emitting elements;
   an inner-layer insulating film to form a contact on the chip surface side of said internal electric circuit and said light-emitting elements and to establish electrical insulation between internal electric circuits, wherein said contact on said light-emitting elements is arranged in the vicinity of said light-emitting region;
   a wiring to connect the contact of the said light-emitting elements with the contact of said internal electric circuits, said wiring formed on said inner-layer insulating film toward the surface side of the chip; and
   a light transmission surface insulating film formed on the chip surface to protect the connection portion between said light-emitting elements and said wiring, wherein said surface insulating film is formed at least on the contact of said light-emitting element to which said wiring is connected and said light-emitting region, said surface insulating film having a thickness such that a decrease in a light transmission amount is not more than 10%.

2. The array chip according to claim 1, wherein the film thickness of said surface insulating film is less than any light-emitting wavelength of said light-emitting elements.

3. The array chip according to claim 2, wherein for the thickness of said surface insulating film, a center value is not less than 0.1 $\mu$m or not more than 0.5 $\mu$m.

4. The array chip according to claim 1, wherein the thermal expansion coefficient of said surface insulating film is the same as that of said inner-layer insulating film.

5. The array chip according to claim 4, wherein said surface insulating film and said inner-layer insulating film comprise $SiO_2$.

6. The array chip according to claim 1, wherein the thickness of said inner-layer insulating film is not less than once and not more than twice the thickness of said surface insulating film.

7. The array chip according to claim 1, wherein said surface insulating film is formed by a vapor deposition.

8. A light-emitting element array head for exposing a light sensitive member to light comprising:
   a plurality of LED light-emitting elements with a light-emitting region on a surface side of a chip;
   a driving IC to control said light-emitting element depending on image signal;

an internal electric circuit to transmit the drive of said driving IC and control said light-emitting element;

an inner-layer insulating film to form a contact on the surface side chip of said internal electric circuit and said light-emitting elements and to establish electrical insulation between internal electric circuits, wherein said contact on the light-emitting elements is arranged in the vicinity of said light-emitting region;

a wiring to connect the contact of the said light-emitting elements with the contact of said internal electric circuits, said wiring formed on said inner-layer insulating film toward the chip surface side; and a light transmission surface insulating film formed on the chip surface to protect the connection portion between said light-emitting elements and said wiring, wherein said surface insulating film is formed at least on the contact of said light-emitting element to which said wiring being connected and said light-emitting region, and said surface insulating film having a thickness such that a decrease in a light transmission amount is not more than 10%.

9. The array chip according to claim 1, wherein said light-emitting element array chip is used for an array head in which said light-emitting element is controlled depending on an image information, and a latent image is formed by exposing uniformly charged light sensitive member surface to the light.

10. The array chip according to claim 1, wherein said light-emitting element array chip is used for the image forming apparatus in which a latent image is formed by exposing the uniformly charged light sensitive member surface, and said latent image is developed.

* * * * *

UNITED STATES PATENT AND TRADEMARK OFFICE
CERTIFICATE OF CORRECTION

PATENT NO. : 6,498,356 B1  Page 1 of 1
DATED : December 24, 2002
INVENTOR(S) : Toshiyuki Sekiya et al.

It is certified that error appears in the above-identified patent and that said Letters Patent is hereby corrected as shown below:

<u>Title page,</u>
Item [57], ABSTRACT,
Line 12, "an" should read -- a --.

<u>Column 4,</u>
Line 26, "lines" should read -- line --;
Line 47, "are" should read -- is --; and
Line 56, "embodiment" should read -- embodiment, --.

<u>Column 7,</u>
Line 3, "off. Transferring" should read -- off. ¶ Transferring --.

Signed and Sealed this

Fifteenth Day of July, 2003

JAMES E. ROGAN
*Director of the United States Patent and Trademark Office*